United States Patent [19]
Kohdaka et al.

[11] Patent Number: 4,727,355
[45] Date of Patent: Feb. 23, 1988

[54] DIGITAL-TO-ANALOG CONVERTER

[75] Inventors: Takayuki Kohdaka; Katsuhiko Ishida; Toshiyuki Takahashi; Takashi Ogata, all of Hamamatsu, Japan

[73] Assignee: Nippon Gakki Seizo Kabushiki Kaisha, Hamamatsu, Japan

[21] Appl. No.: 852,119

[22] Filed: Apr. 15, 1986

[30] Foreign Application Priority Data

Apr. 19, 1985 [JP] Japan ................................. 60-83819

[51] Int. Cl.⁴ .............................................. H03M 1/68
[52] U.S. Cl. .............................................. 340/347 DA
[58] Field of Search .................................. 340/347 DA

[56] References Cited
U.S. PATENT DOCUMENTS

| 3,303,489 | 2/1967 | Krucoff | 340/347 DA |
| 3,555,540 | 8/1966 | Hartke | 340/347 DA |
| 3,670,326 | 6/1972 | Sloane | 340/347 DA |
| 3,673,398 | 6/1972 | Loffbourrow | 340/347 DA |
| 3,705,359 | 12/1972 | Kappes | 340/347 DA |
| 4,177,457 | 12/1979 | Howlett | 340/347 DA |
| 4,250,492 | 2/1981 | Yamakido | 340/347 DA |
| 4,305,063 | 12/1981 | Hanson | 340/347 DA |

OTHER PUBLICATIONS

Hnatek, "A User's Handbook of D/A and A/D Converters", 6/1976, pp. 90–91.

Sheingold "Analog-To-Digital Conversion Notes", ©1980, p. 108.

Primary Examiner—William M. Shoop, Jr.
Assistant Examiner—Richard K. Blum
Attorney, Agent, or Firm—Spensley Horn Jubas & Lubitz

[57] ABSTRACT

A digital-to-analog converter (DAC) converts digital input data into an analog output signal with less harmonic distortion over an entire signal-level range. An exponent value detector detects from the digital input data the number of bits by which the digital input data is to be shifted to form a mantissa part thereof. A digital shifter shifts the digital input data in accordance with the output of the exponent value detector, and outputs the mantissa part which is then supplied to a mantissa-part DAC. The mantissa-part DAC comprises an R-2R resistor ladder network and outputs the result of DA conversion of the mantissa part to an exponent-part DAC. The exponent DAC shifts the output of the mantissa-part DAC by an amount determined by the output of the exponent value detector, and outputs the shifted signal as the analog output signal of this DAC. A control circuit is provided between the digital shifter and the mantissa-part DAC, which prevents, in accordance with the output of the exponent value detector, the least significant bits of the mantissa-part DAC from operatively functioning to thereby decrease the number of operable bits thereof when the magnitude of the digital input data is small.

16 Claims, 8 Drawing Figures

DIGITAL-TO-ANALOG CONVERTER 10

FIG. 4

DIGITAL SHIFTER 21

EXPONENT-PART DAC 50

DIGITAL-TO-ANALOG CONVERTER

BACKGROUND OF THE INVENTION

Field of the Invention

This invention relates generally to a digital-to-analog converter (hereinafter referred to as "DAC"), and in particular to a floating-point-type DAC which can implement a digital-to-analog conversion of an input data with less distortion irrespective of the magnitude thereof.

There has been proposed a floating-point-type DAC which includes a mantissa-part DAC and an exponent-part DAC. Although such a floating-point-type DAC has a high conversion accuracy and can convert an input data of a small magnitude into an analog form with less distortion, it must be supplied with an input data in the form of a floating point number.

In order to overcome the above deficiencies, the inventors proposed in co-pending U.S. patent application Ser. No. 781,767 a DAC which can deal with an input data in the form of an ordinary fixed-point binary number. As shown in FIG. 1, the DAC comprises a digital shifter 1 for shifting bits $I_0$ to $I_{15}$ of an input data $D_{IN}$ to extract therefrom N consecutive bits to be supplied to a mantissa-part DAC 2. A shift number detector 3 decodes a predetermined number of higher-order bits of the input data $D_{IN}$ to produce a signal representative of the number of bits to be shifted by the digital shifter 1 and supplies the produced signal to the digital shifter 1 and an exponent-part DAC 4. In the case where the input data $D_{IN}$ is represented in two's complement, the digital shifter 1 extracts the N consecutive bits in accordance with the signal fed from the shift number detector 3 in such a manner that the greater the absolute value of the input data $D_{IN}$ is, the higher the order of the N consecutive bits extracted from the input data $D_{IN}$ is. Also, the exponent-part DAC 4 produces an exponent part of the output signal $V_{OUT}$ in accordance with the signal fed from the shift number detector 3.

With the DAC shown in FIG. 1, if the mantissa-part DAC 2 has a higher resolution (for example, a resolution of about 12 bits), the minimum step of variation of the output signal $V_{OUT}$ becomes smaller, so that a total harmonic distortion of the output signal $V_{OUT}$ of higher signal levels desirably becomes smaller. However, even though the mantissa-part DAC 2 is manufactured so as to have a 12-bit resolution, the actual accuracy thereof is 10 bits at the best. In such a case, although the low accuracy does not much affect on the higher level signals, the total harmonic distortion of the output signal of lower signal levels becomes worse.

On the other hand, it is not difficult to manufacture a mantissa-part DAC having an accuracy of about 10 bits, so that it is possible to improve the total harmonic distortion of the output signal of lower signal levels by arranging the mantissa-part DAC to have a resolution of 10 bits. In this case, however, the total harmonic distortion of the output signal of higher signal levels will be deteriorated since the minimum step of variation of the higher level output signal becomes large.

Thus, with the aforesaid floating-point-type DAC, the total harmonic distortion of the output signal is deteriorated in one of the higher and lower signal level ranges depending on the selection of the accuracy of a mantissa-part DAC thereof.

SUMMARY OF THE INVENTION

It is therefore an object of the present invention to provide a DAC in which total harmonic distortion of an output signal can be minimized over an entire range of its signal level.

According to an aspect of the present invention, there is provided a digital-to-analog converter for converting digital input data into an analog output signal comprising detector means responsive to the digital input data for detecting the magnitude thereof, the detector means outputting a detection signal representative of the magnitude of the digital input data; digital-to-analog converting means of a predetermined number of bits responsive to the detection signal for converting a mantissa-part of the digital input data into an intermediate analog signal; analog shift means responsive to the detection signal for analogically shifting the intermediate analog signal by an amount corresponding to an exponent part of the digital input data, the analog shift means outputting the shifted analog signal as the analog output signal; and control means responsive to the detection signal for changing the number of bits of the digital-to-analog converting means, the control means decreasing the number of bits of the digital-to-analog converting means with a decrease of the magnitude of the digital input data.

BRIEF DESCRIPTION OF THE DRAWINGS

FIG. 4 is an illustration showing the relation between the bits of the input data $D_{IN}$ and the bits supplied to the mantissa-part DAC 22 of the DAC 10 of FIG. 2;

DESCRIPTION OF THE PREFERRED EMBODIMENTS OF THE INVENTION

Embodiments of the present invention will now be described with reference to the accompanying drawings.

Figure 1:
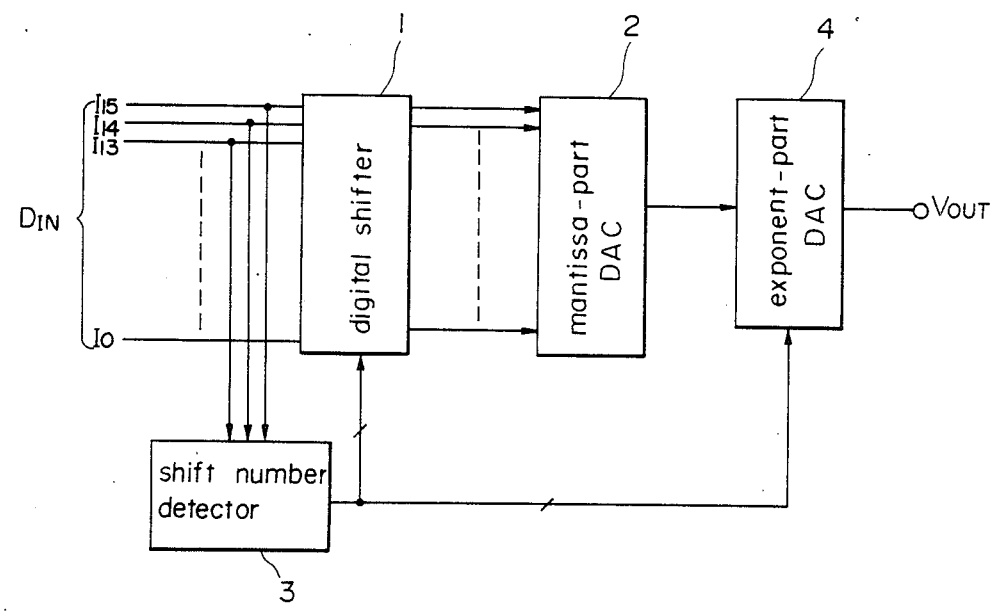
FIG. 1 is a block diagram of a DAC (digital-to-analog converter) before improvement.
Figure 2:
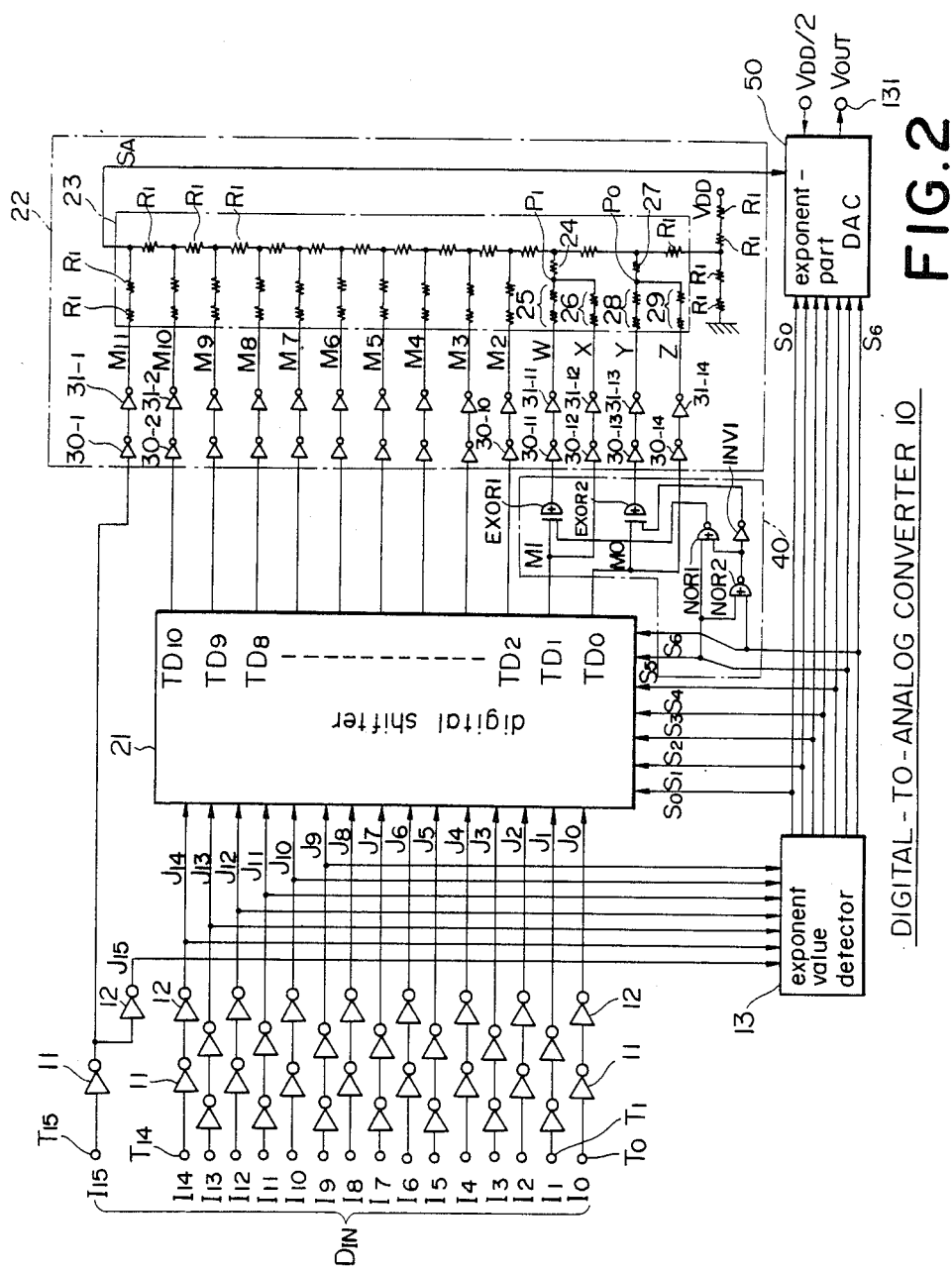
FIG. 2 is a block diagram of a DAC 10 provided in accordance with a first embodiment of the present invention.

FIG. 2 shows a block diagram of a DAC provided in accordance with a first embodiment of the present invention. In FIG. 2, sixteen-bit digital data $D_{IN}$ represented in two's complement is applied to input terminals $T_0$ to $T_{15}$, wherein the sign bit thereof is applied to the input terminal $T_{15}$ and the LSB (least significant bit) thereof is applied to the input terminal $T_0$. Each of the bits $I_0$ to $I_{15}$ is passed through serially connected two inverters 11 and 12, whereby sixteen bit-data $J_0$ to $J_{15}$ equivalent respectively to the bits $I_0$ to $I_{15}$ are produced. The higher-order seven bits $J_9$ to $J_{15}$ are supplied to an exponent value detector 13 which decodes the bits $J_9$ to $J_{15}$ to produce one of seven signals $S_0$ to $S_6$ representing an exponent value of an analog output signal $V_{OUT}$ of this DAC 10.

Figure 3:
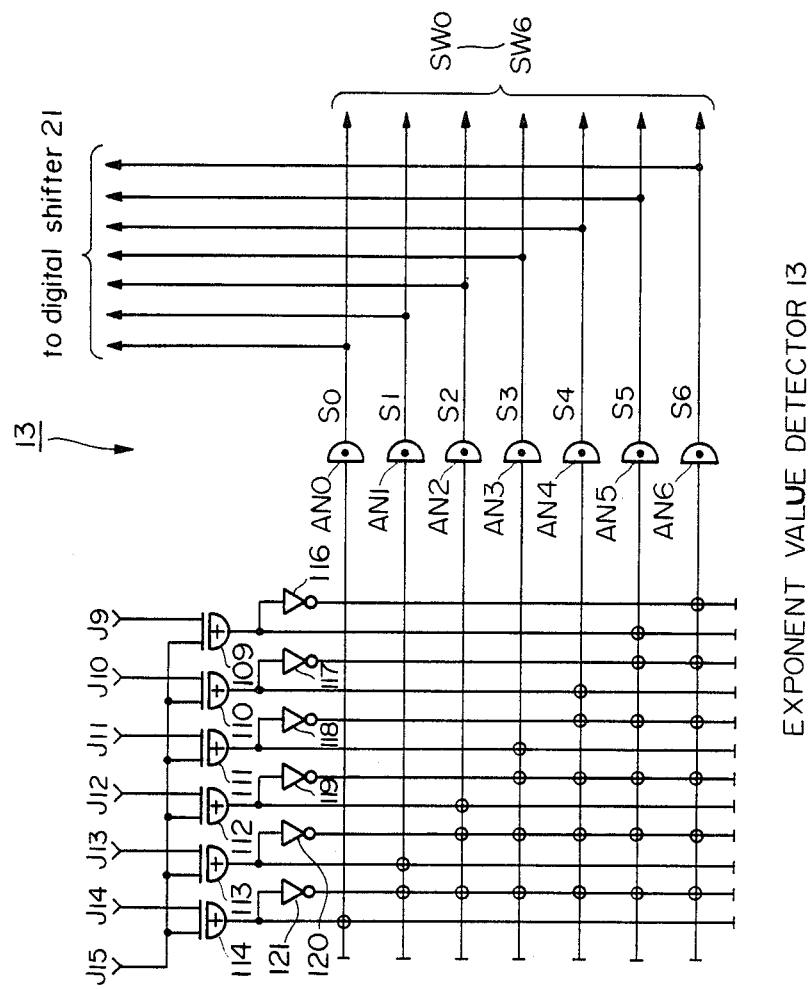
FIG. 3 is a circuit diagram of the exponent value detector 13 of the DAC 10 shown in FIG. 2.

As shown in FIG. 3, the exponent value detector 13 comprises six exclusive-OR gates 109 to 114 to which the bits $J_9$ to $J_{14}$ are respectively supplied at one input terminals thereof. The other input terminals of the exclusive-OR gates 109 to 114 are supplied with the bit $J_{15}$. This exponent value detector 13 further comprises seven AND gates $AN_0$ to $AN_6$. Input terminals of each of the AND gates $AN_0$ to $AN_6$ are indicated by circles on an input signal line of the corresponding one of the AND gates. Output terminals of the exclusive-OR gates 114 to 109 are connected to the first input terminals of the AND gates $AN_0$ to $AN_5$, respectively. The output terminals of the exclusive-OR gates 109 to 114 are also connected to input terminals of inverters 116 to 121, respectively. An output terminal of the inverter 116 is connected to the first input terminal of the AND gate $AN_6$, and an output terminal of the inverter 117 is connected to the second input terminals of the AND gates $AN_5$ and $AN_6$. An output terminal of the inverter 118 is connected to the second input terminal of the AND gate $AN_4$ and the third input terminals of the AND gates $AN_5$ and $AN_6$. In a similar manner, an output terminal of the inverter 119 is connected to the input terminals of the AND gates $AN_3$ to $AN_6$, an output terminal of the inverter 120 to the input terminals of AND gates $AN_2$ to $AN_6$, and an output terminal of the inverter 121 to the input terminals of the AND gates $AN_1$ to $AN_6$. When opened, the AND gates $AN_0$ to $AN_6$ output the signal $S_0$ to $S_6$, respectively. With this exponent value detector 13, when the bit $J_{15}$ is "0", that is to say, when the input data $D_{IN}$ is a positive value, "N" of the outputted signal $S_N$ (N is any one of "1" to "6") is determined by the number of "0" bits counted from the bit $J_{14}$ toward the bit $J_9$ until a "1" bit is first detected. In other words, the "N" is determined by the number of leading "0" bits of the input data $D_{IN}$. For example, when the bit $J_{15}$ is "0" and if only the bits $J_{13}$ and $J_{11}$ are "1", the number of leading "0" bits of the input data $D_{IN}$ is "1", so that the signal $S_1$ is outputted. On the other hand, when the bit $J_{15}$ is "1", that is to say, when the input data $D_{IN}$ is negative, the "N" of the signal $S_N$ is determined by the number of "1" bits counted from the bit $J_{14}$ toward the bit $J_9$ until a "0" bit is first detected. In other words, the "N" is determined by the number of leading "1" bits of the input data $D_{IN}$. For example, in the case where only the bits $J_{10}$ and $J_9$ are "0", the number of leading "1" bits of the input data $D_{IN}$ is "4", so that the signal $S_4$ is outputted. Thus, the exponent value detector 13 determines the "N" of the signal $S_N$ based on the number of those bits of the input data $D_{IN}$ which are counted from the bit $I_{14}$ toward the bit $I_9$ until a bit different in state from the bit $I_{15}$ is first detected. In the case where a bit which is different in state from the sign bit is not detected from the bits $J_{14}$ to $J_9$, the exponent value detector 13 outputs the signal $S_6$ irrespective of the state of the bit $J_{15}$. Thus, the exponent value detector 13 selectively outputs the signal $S_N$ in accordance with the absolute value of the input data $D_{IN}$ represented by the bits $I_{14}$ to $I_0$, wherein the "N" becomes greater when the absolute value of the input data becomes smaller. And, when the absolute value of the input data $D_{IN}$ is less than "512" in decimal, the signal $S_6$ is always outputted. In the case where the input data $D_{IN}$ takes the form of an ordinary binary value, an inversion of the bit $I_{15}$ is applied to the exponent value detector 13 instead of the bit $J_{15}$.

Figure 4:
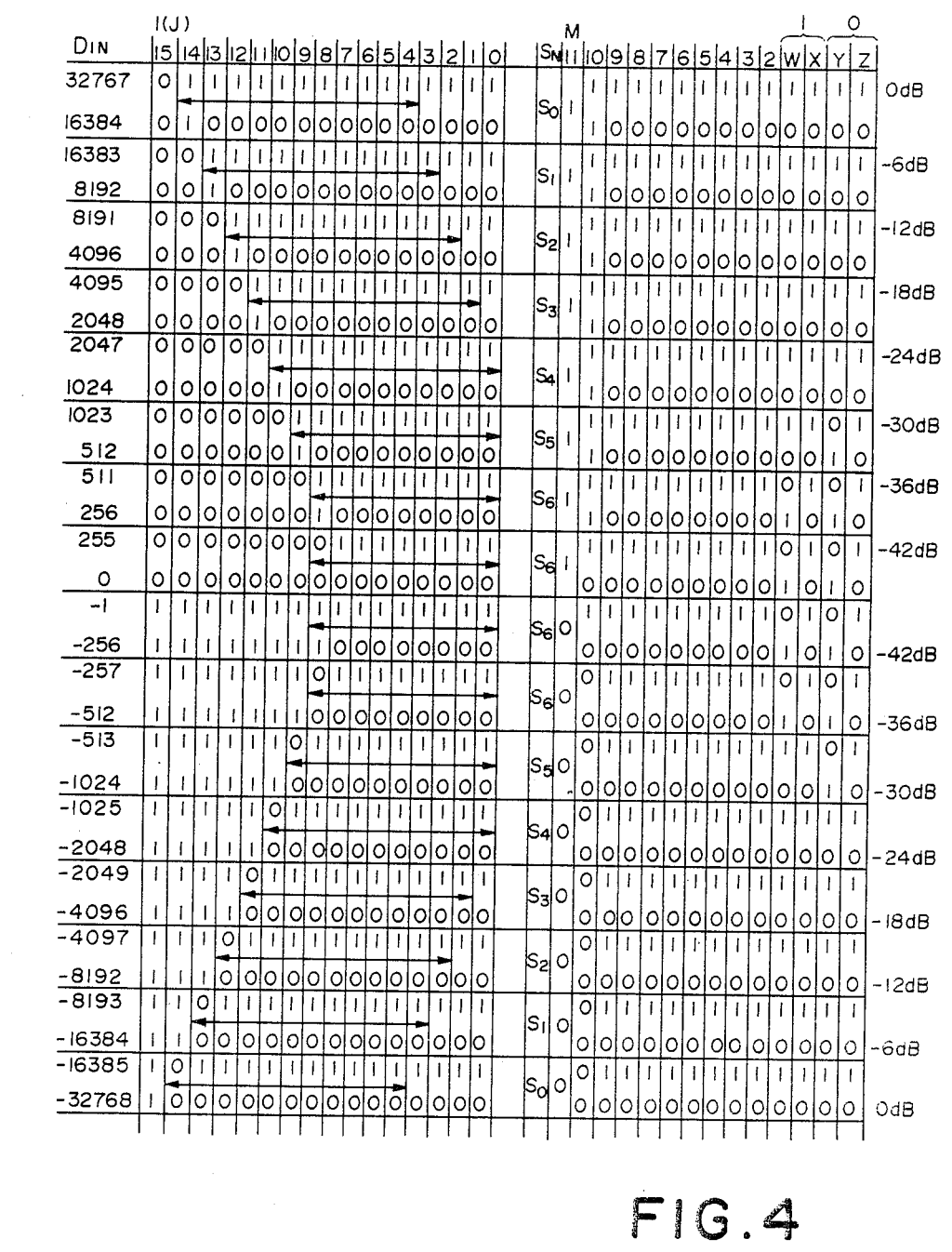

Referring again to FIG. 2, the bits $J_{14}$ to $J_0$ are also supplied to a digital shifter 21 which shifts the supplied bits $J_{14}$ to $J_0$ by bits whose number is determined in accordance with the signals $S_0$ to $S_6$. The digital shifter 21 then outputs, from output terminals $TD_0$ to $TD_{10}$ thereof, eleven consecutive bits among the bits $J_{14}$ to $J_0$ obtained as the result of its shift operation. When supplied with the signal $S_0$, the digital shifter 21 outputs the bits $J_4$ to $J_{14}$ from the output terminals $TD_0$ to $TD_{10}$, respectively, and when supplied with the signal $S_1$, it outputs the bits $J_3$ to $J_{13}$ from the output terminals $TD_0$ to $TD_{10}$, respectively. In a similar manner, when supplied with the signal $S_2$, the digital shifter 21 outputs the bits $J_2$ to $J_{12}$ from the output terminals $TD_0$ to $TD_{10}$, respectively, and when supplied with the signal $S_3$, it outputs the bits $J_1$ to $J_{11}$ from the output terminals $TD_0$ to $TD_{10}$, respectively. And, when supplied with the signal $S_4$, the digital shifter 21 outputs the bits $J_0$ to $J_{10}$ from the output terminals $TD_0$ to $TD_{10}$, respectively (see arrows in FIG. 4). Also, when supplied with the signal $S_5$ outputted from the exponent value detector 13, the digital shifter 21 outputs the bits $J_0$ to $J_9$ from the output terminals $TD_1$ to $TD_{10}$, respectively. In this case, the digital shifter 21 outputs an indefinite signal (a "1" or a "0" signal) from the output terminal $TD_0$. On the other hand, when supplied with the signal $S_6$, the digital shifter 21 outputs the bits $J_0$ to $J_8$ from the output terminals $TD_2$ to $TD_{10}$, respectively. In this case, the digital shifter 21 outputs indefinite signals from the output terminals $TD_0$ and $TD_1$.

Figure 5:
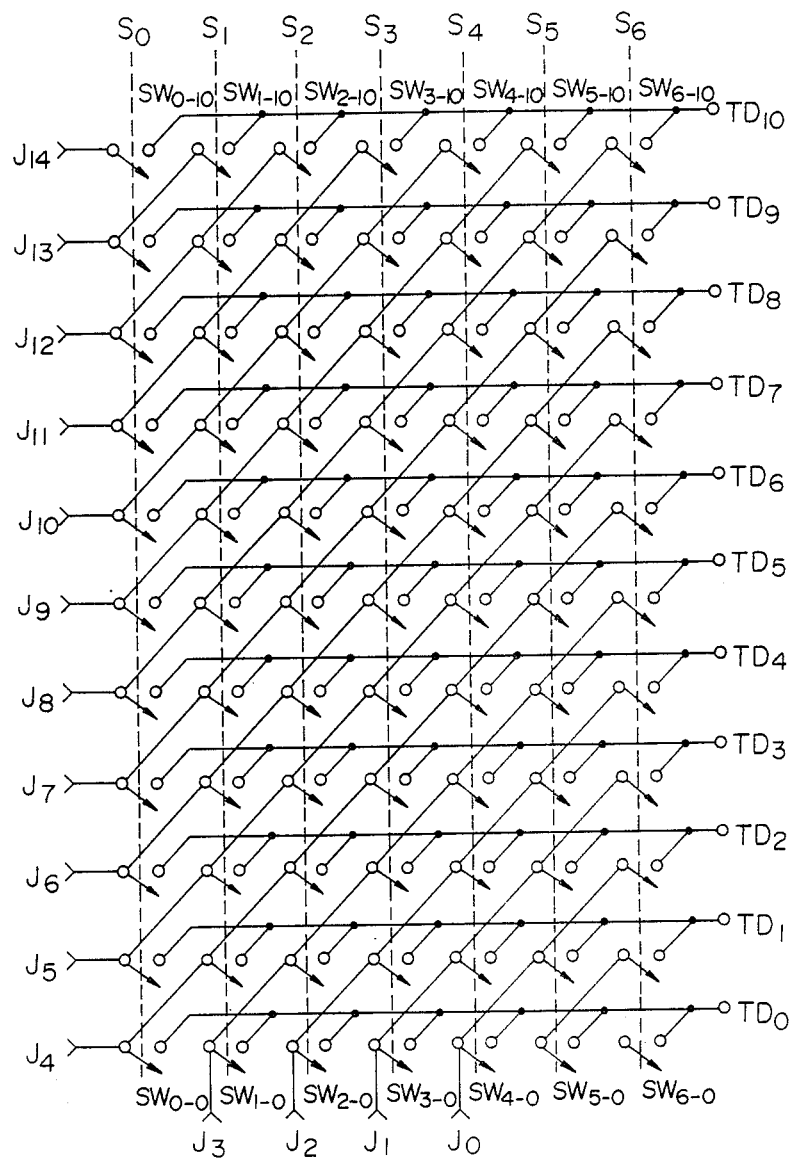
FIG. 5 is a circuit diagram of the digital shifter 21 of the DAC 10 of FIG. 2.

The digital shifter 21 is constructed, for example, as shown in FIG. 5. The digital shifter 21 comprises seven columns of switches $SW_{0-0}$ to $SW_{0-10}$, $SW_{1-0}$ to $SW_{1-10}$, ... $SW_{6-0}$ to $SW_{6-10}$. These switches may be constituted by FETs, transistors or the like. In this case, all of the switches in the same column are closed when the corresponding one of the signals $S_0$ to $S_6$ is applied thereto. For example, the switches $SW_{0-0}$ to $SW_{0-10}$ in the first column are closed when the signal $S_0$ is supplied thereto. In this case, the bits $J_{14}$ to $J_4$ are supplied respectively to the output terminals $TD_{10}$ to $TD_0$ of this digital shifter 21. In a similar manner, when the signal $S_1$ is supplied to the digital shifter 21, the switches $SW_{1-0}$ to $SW_{1-10}$ close, so that the bits $J_{13}$ to $J_3$ are supplied respectively to the output terminals $TD_{10}$ to $TD_0$ of this digital shifter 21. And, when the signal $S_6$ is supplied to the digital shifter 21, the switches $SW_{6-0}$ to $SW_{6-10}$ close, so that the bits $J_8$ to $J_0$ are supplied respectively to the output terminals $TD_8$ to $TD_2$.

Referring again to FIG. 2, shown at 22 is a mantissa-part DAC of this DAC 10 which comprises 12-stage 2R-R resistor ladder network 23. An R resistor of each of the first to twelfth stages of the ladder network 23 is composed of a resistor having a resistance value of $R_1$, and a 2R resistor of each of the first to tenth stages of the ladder network 23 is composed of serially connected two resistors each having a resistance value of $R_1$. A 2R resistor of the eleventh stage of the ladder network 23 is composed of a resistor 24 of $R_1$ and two groups of resistors 25 and 26 each group composed of serially connected two resistors each having a resistance value of $R_1$, a junction point $P_1$ of the two groups of resistors 24 and 25 being connected to the resistor 24. Similarly, a 2R resistor of the twelfth stage of the ladder network 23 is composed of a resistor 27 of $R_1$ and two groups of resistors 28 and 29 each group composed of serially connected two resistors each having a resistance value of $R_1$, a junction point $P_2$ of the two groups of resistors 28 and 29 being connected to the resistor 27. The free end of the R resistor of the twelfth or the last stage of the ladder network 23 is connected to a source of voltage $V_{DD}$ through serially connected two resistors each having a resistance value of $R_1$, and also connected to the ground through serially connected two resistors each having a resistance value $R_1$. The 2R resistor of the first stage of the ladder network 23 is connected with serially connected two inverters $30_{-1}$ and $31_{-1}$, and the 2R resistor of the second stage of the ladder network 23 is connected with serially connected two inverters $30_{-2}$ and $31_{-2}$. This is true with respect to the 2R resistors of the third to tenth stages of the ladder network 23. Similarly, the resistor group 25 is connected with serially connected two inverters $30_{-11}$ and $31_{-11}$, and the resistor group 26 is connected with serially connected two inverters $30_{-12}$ and $31_{-12}$. This is true with the resistor groups 28 and 29. An inversion of the bit $I_{15}$ by the inverter 11 is supplied to an input terminal of the inverter $30_{-1}$, and the bits outputted from the output terminals $TD_{10}$ to $TD_2$ of the digital shifter 21 are supplied to input terminals of the inverters $30_{-1}$ to $30_{-10}$, respectively. The two bits outputted from the output terminals $TD_1$ and $TD_0$ are supplied to a mantissa-part-bit control circuit 40. Each of the inverters $31_{-1}$ to $31_{-14}$ outputs a ground level signal as "0" and a voltage equal to $V_{DD}$ as "1".

The mantissa-part-bit control circuit 40 is provided for changing the number of operable bit-stages of the mantissa-part DAC 22. The mantissa-part-bit control circuit 40 comprises two exclusive OR gates EXOR1 and EXOR2, two NOR gates NOR1 and NOR2 and an inverter INV1. A signal $M_1$ outputted from the terminal $TD_1$, which corresponds to the eleventh bit-stage of the mantissa-part DAC 22, is supplied to one input terminal of the exclusive OR gate EXOR1. The signal $M_1$ is also supplied to the input terminal of the inverter $30_{-12}$, whereby a signal X is obtained at the output terminal of the inverter $31_{-12}$. The other input terminal of the exclusive OR gate EXOR1 is supplied with an output signal the NOR gate NOR1. An output of the exclusive OR gate EXOR1 is supplied to the input terminal of the inverter $30_{-11}$, whereby a signal W is obtained at the output terminal of the inverter $31_{-11}$. A signal $M_0$ outputted from the terminal $TD_0$, which corresponds to the twelfth bit-stage of the mantissa-part DAC 22, is supplied to one input terminal of the exclusive OR gate EXOR2. The signal $M_0$ is also supplied to the input terminal of the inverter $30_{-14}$, whereby a signal Z is obtained at the output terminal of the inverter $31_{-14}$. The other input terminal of the exclusive OR gate EXOR2 is supplied with an output signal the inverter INV1. An output of the exclusive OR gate EXOR2 is supplied to the input terminal of the inverter $30_{-13}$, whereby a signal Y is obtained at the output terminal of the inverter $31_{-13}$. The signals $S_5$ and $S_6$ are supplied to input terminals of the NOR gate NOR2, and the signal $S_5$ and an output of the NOR gate NOR2 are supplied to input terminals of the NOR gate NOR1. The output signal of the NOR gate NOR2 is also supplied to an input terminal of the inverter INV1. The mantissa-part-bit control circuit 40 thus constructed causes the four signals W, X, Y and Z supplied respectively to the resistor groups 25, 26, 28 and 29 to be changed in accordance with the states of the signals $S_5$ and $S_6$, as shown in Table 1.

TABLE 1

| $S_5$ | $S_6$ | W | X | Y | Z |
|---|---|---|---|---|---|
| 0 | 0 | $M_1$ | $M_1$ | $M_0$ | $M_0$ |
| 1 | 0 | $\overline{M_1}$ | $M_1$ | $\overline{M_0}$ | $M_0$ |
| 0 | 1 | $M_1$ | $M_1$ | $M_0$ | $M_0$ |

Figure 6:
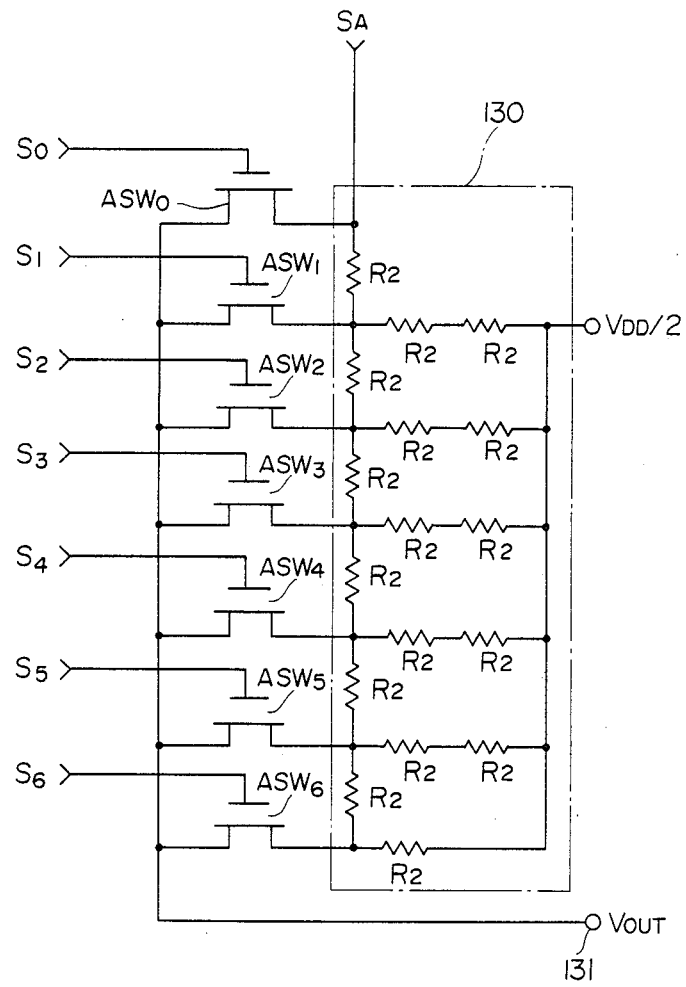
FIG. 6 is a circuit diagram of the exponent-part DAC 50 of the DAC of FIG. 2.

An output signal $S_A$ of the mantissa-part DAC 22 which appears at the junction point of the 2R and R resistors of the first stage of the ladder network 23 is supplied to an exponent-part DAC 50 of seven-stage type. As shown in FIG. 6, the exponent part DAC 50 comprises seven analog switches $ASW_0$ to $ASW_6$ and a six-stage R-2R resistor ladder network 130. Each stage of the ladder network 130 comprises an R resistor of a resistance value of $R_2$ and a 2R resistor composed of serially connected two resistors each having a resistance value of $R_2$. The free end of the R resistor of the first stage of the ladder network 130 is supplied with the output signal $S_A$ of the mantissa-part DAC 22, while the free ends of the 2R resistors of all of the stages of the ladder network 130 are connected to a source of voltage $V_{DD}/2$. The free end of the R resistor of the first stage of the ladder network 130 and the junction points between the R and 2R resistors of the first to sixth stages of the ladder network 130 are connected respectively through analog switches $ASW_0$ to $ASW_6$ to an output terminal 131 of this DAC 10. And, the signals $S_0$ to $S_6$ outputted from the exponent value detector 13 are supplied respectively to control terminals of the analog switches $ASW_0$ to $ASW_6$ so that one of the switches is brought into an ON state by the corresponding one of the signals $S_0$ to $S_6$ which is in the "1" state.

The operation of this DAC 10 will now be described. As will be appreciated from FIG. 4, one of the signals $S_0$ to $S_6$ is outputted in accordance with the magnitude of the input data $D_{IN}$. For example, when the input data $D_{IN}$ is in the range of between "32767" and "16384" in decimal, the signal $S_0$ is outputted, and when the input data $D_{IN}$ is in the range of between "16383" and "8192" in decimal, the signal $S_1$ is outputted. When the input data $D_{IN}$ is relatively large in magnitude, that is, when a signal level of the output signal $V_{OUT}$ is greater than $-30$ dB, one of the five signals $S_0$ to $S_4$ is outputted. In this case, the signals $S_5$ and $S_6$ are both "0", so that the NOR gate NOR2 outputs a "1" signal. And therefore, the inverter INV1 and the NOR gate NOR1 both output "0", so that the exclusive OR gates EXOR1 and EXOR2 serves as mere buffers. Consequently, both of the signals W and X become equal in state to the signal $M_1$, and also both of the signals Y and Z become equal in state to the signal $M_0$. When the signals W and X are equal in state to each other, the two resistor groups 25 and 26 serve as a single resistor having a resistance value of $R_1$. And therefore, if the signals W and X are equal in state to the signal $M_1$, the application of the signals W and X to the junction point $P_1$ respectively through the resistor groups 25 and 26 is equivalent to an application of the signal $M_1$ to the junction point $P_1$ through a resistor of $R_1$. Similarly, if the signals Y and Z are equal in state to the signal $M_0$, the application of the signals Y and Z to the junction point $P_0$ respectively through the resistor groups 28 and 29 is equivalent to an application of the signal $M_0$ to the junction point $P_0$ through a resistor of $R_1$. Thus, when one of the signals $S_0$ to $S_4$ is outputted, the mantissa-part DAC 22 operates as a twelve-bit DAC. In this case, the digital shifter 21 outputs from the output terminals $TD_{10}$ to $TD_0$ thereof those consecutive eleven bits among the bits $J_{14}$ to $J_0$ which are selected in accordance with the one of the signals $S_0$ to $S_4$ (see the arrows shown in FIG. 4). Thus, in the case where the magnitude of the input data $D_{IN}$ is greater than a predetermined value, the mantissa-part DAC 22 operates as a twelve-bit DAC, so that the minimum step of variation of the output signal $V_{OUT}$ is rendered small, whereby the harmonic distortion thereof is minimized.

When the magnitude of the input data $D_{IN}$ is relatively small, that is, when the output signal $V_{OUT}$ is not greater than $-30$ dB but greater than $-36$ dB, the signal $S_5$ is outputted. In this case, the relation between the signal $M_1$ and the signals W and X is the same as that in the above case, however the relation between the signal $M_0$ and the signals Y and Z is changed to that shown in Table 1. More specifically, the signals Y and Z are in inversed relation in state to each other irrespective of the state of the signal $M_0$. In this case, if one of the two signals Y and Z is at the ground level, the other of the signals is at a source voltage level ($V_{DD}$), so that the potential at the junction point $P_0$ becomes equal to $V_{DD}/2$. As a result, the function of the mantissa-part DAC 22 in this case becomes equivalent to that of the mantissa part DAC 22 from which the least significant bit stage is removed. In other words, the mantissa-part DAC 22 operates as a DAC of eleven-bit type. When the signal $S_5$ is outputted, the digital shifter 21 outputs the bits $J_0$ to $J_9$ from the output terminals $TD_1$ to $TD_{10}$, respectively, so that the lower-order ten bits of the input data $D_{IN}$ are supplied to the mantissa-part DAC 22.

When the magnitude of the input data $D_{IN}$ is smaller than that in the above case, the signal $S_6$ is outputted from the exponent value detector 13. Consequently, the signals W and X are in inversed relation to each other, and the signals Y and Z are also in inversed relation to each other. And therefore, the potentials at the junction points $P_1$ and $P_0$ both become equal to half of the source voltage $V_{DD}$, i. e., $V_{DD}/2$, so that the least significant two bits are removed from the mantissa-part DAC 22. Thus, when the signal $S_6$ is outputted, the mantissa-part DAC 22 operates as a DAC of a ten-bit type. In this case, the digital shifter 21 outputs the bits $J_0$ to $J_8$ from the output terminals $TD_2$ to $TD_{10}$, so that the lower-order nine bits of the input data $D_{IN}$ are supplied to the mantissa-part DAC 22.

Thus, when the magnitude of the input data $D_{IN}$ is small, the mantissa-part DAC 22 operates as a DAC of an eleven-bit type or a ten-bit type, so that the total harmonic distortion of the output signal $V_{OUT}$ is prevented from increasing.

Description will now be given as to the total harmonic distortion characteristic of the above described DAC 10.

Figure 7:
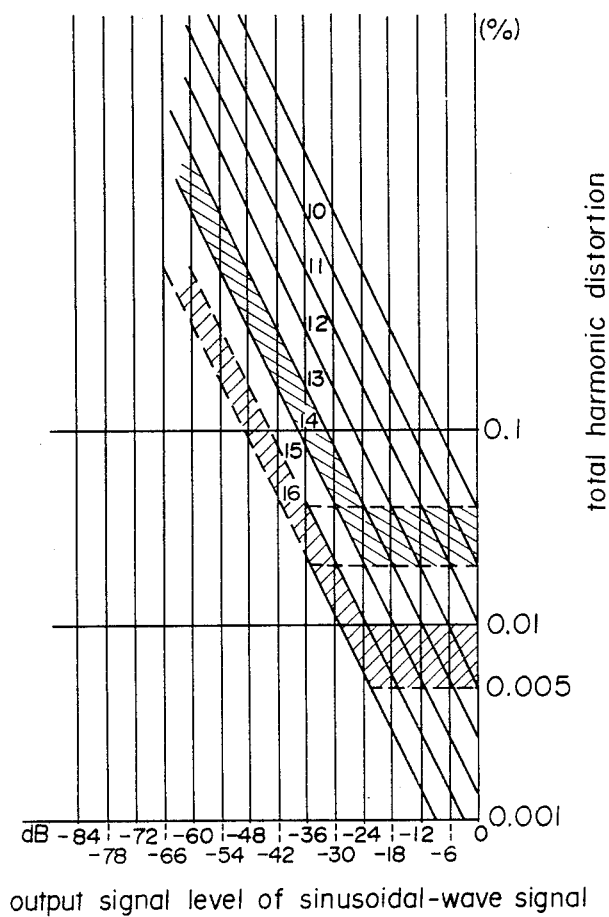
FIG. 7 is a chart showing total harmonic distortions of the DAC 10 and various other DACs.

FIG. 7 illustrates total harmonic distortions of various DACs in terms of signal levels of output signals thereof. In FIG. 7, areas lying between two adjacent lines inclined downwardly in the right-hand direction respectively define total harmonic distortions of DACs of ten-bit to sixteen-bit types which have no exponent-part DAC. The area between two adjacent broken lines defines the total harmonic distortion of an ordinary floating-point-type DAC which has a ten-bit type mantissa-part DAC having an accuracy of ten bits and a seven-stage exponent-part DAC. As the exponent-part DAC of this ordinary floating-point-type DAC is of a seven-stage type, the total harmonic distortion becomes flat in the region of above $-36$ dB. The area hatched by lines inclined downwardly in the right-hand direction defines the total harmonic distortion of another ordinary floating-point-type DAC which has a twelve-bit type mantissa-part DAC having an accuracy of ten bits and a five-stage exponent-part DAC. Since the mantissa-part DAC of this ordinary floating-point-type DAC is inferior in accuracy to the mantissa-part DAC of the first-mentioned ordinary floating-point-type DAC by two bits, the total harmonic distortion is deteriorated in the region of smaller signal levels. On the other hand, the area hatched by lines inclined downwardly in the left-hand direction defines the total harmonic distortion of a still another ordinary floating-point-type DAC which has a twelve-bit type mantissa-part DAC having an accuracy of twelve bits and a five-stage exponent-part DAC (i. e., an ideal DAC of a floating-point type). As the exponent-part DAC of this ordinary floating-point-type DAC is of a five-stage type, the error in the mantissa-part DAC is rendered $\frac{1}{2}^4$ times smaller. And therefore, the total harmonic distortion of this ordinary floating-point-type DAC with respect to the signals below $-24$ dB is the same as that of the sixteen-bit DAC having no exponent-part DAC, and the total harmonic distortion thereof in the region of above $-24$ dB is flat.

With the aforesaid DAC 10 provided in accordance with the first embodiment of the invention, when the signal level is small, the number of bits of the mantissa-part DAC 22 becomes equal to ten, wherein the accuracy thereof is also ten bits. And, the number of stages of the exponent-part DAC 50 is seven in this case, so that the error in the mantissa-part DAC 22 is rendered $\frac{1}{2}^6$ smaller. Thus, when the signal level is below $-36$ dB, the aforesaid DAC 10 operates as a 16-bit DAC having no mantissa-part. When the signal level is above $-24$ dB, the signal $S_4$ is outputted, so that only the five stages of the exponent-part DAC 50 operates. Consequently, the signal level of the output signal becomes greater, so that the total harmonic distortion of the DAC 10 is flat. When the signal level is between $-24$ dB and $-36$ dB, the number of bits of the mantissa-part DAC 22 becomes equal to eleven bits, wherein the accuracy of the mantissa-part DAC 22 is ten bits. In this case, the number of stages of the exponent-part DAC 50 is six, so that the total harmonic distortion of the DAC 10 is defined by an area in the form of steps. Thus, the total harmonic distortion of the DAC 10 according to this embodiment is defined by an area substantially equal to the area for the ideal floating-point-type DAC hatched by the lined inclined downwardly in the left-hand direction.

Figure 8:
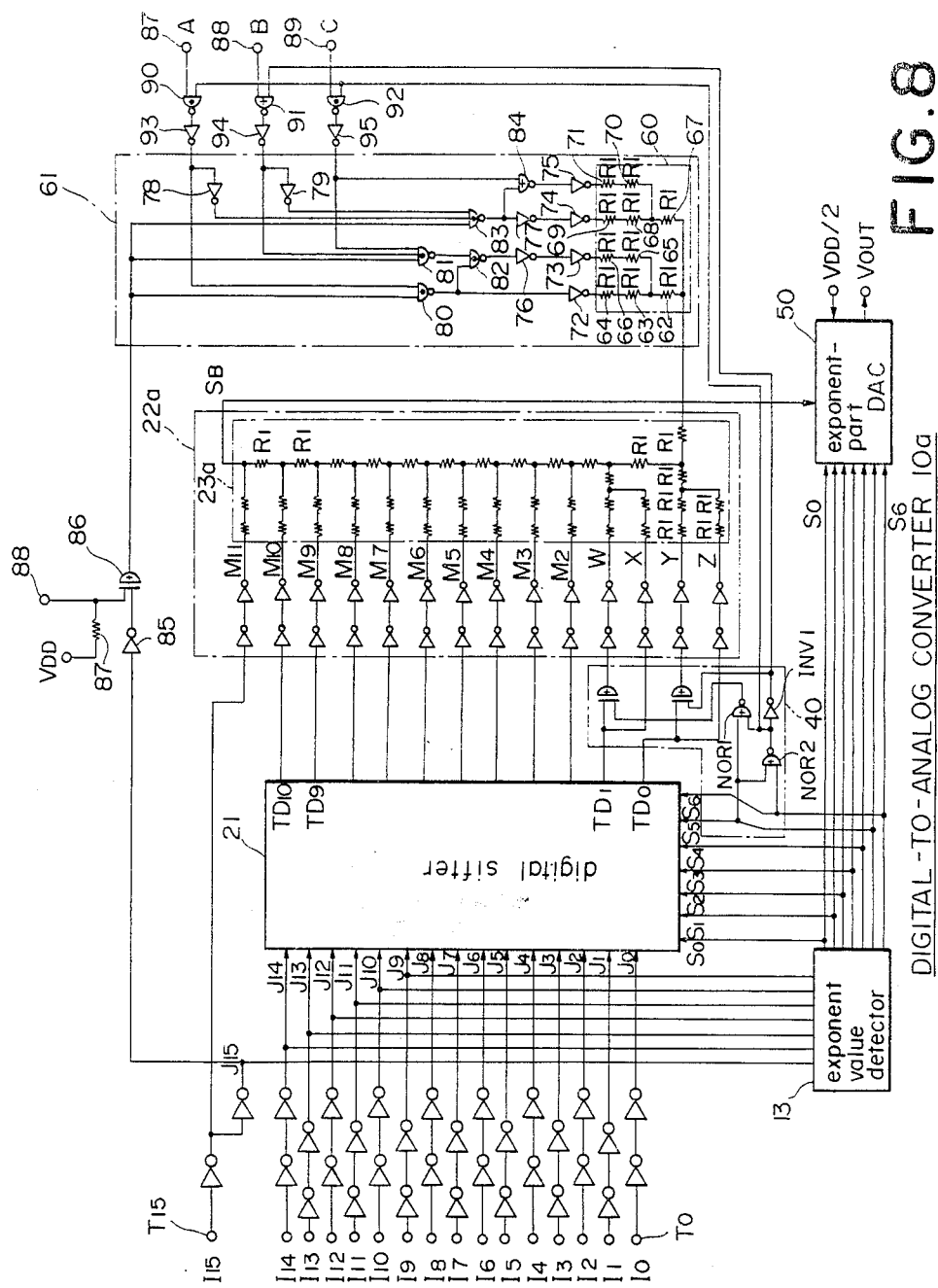
FIG. 8 is a block diagram of a DAC 22a provided in accordance with a second embodiment of the invention.

A second embodiment of the present invention will now be described with reference to FIG. 8.

A DAC 10a according to this second embodiment differs from the DAC 10 shown in FIG. 2 in the following respects:

An R resistor (R1) of the last bit-stage of an R-2R ladder resistor network 23a of a mantissa-part DAC 22a is connected with a resistor network 60 of an error correction circuit 61. The resistor network 60 comprises resistors 62 to 71 each having a resistance value of $R_1$. The error correction circuit 61 further comprises inverters 72 to 79, NAND gates 80 to 83 and a NOR gate 84. An inversion of the bit $J_{15}$ by an inverter 85 is supplied to one input terminal of an exclusive OR gate 86, the other input terminal of which is connected through a resistor 87 to the source of voltage $V_{DD}$. The other input terminal of the exclusive OR gate 86 is also connected to a terminal 88. If the error correction circuit 61 should work when the MSB of the input data $D_{IN}$ is in the state of "0", a "0" signal is applied to the terminal 88. On the other hand, if the error correction circuit 61 should work when the MSB of the input data $D_{IN}$ is in the "1" state, a "1" signal is applied to the terminal 88. Thus, when an error correction is required, a "1" signal is outputted from an output terminal of the exclusive OR gate 86 to the error correction circuit 61. Three input terminals 87 to 89 are provided for receiving control bits A, B and C, respectively. The control bit A is supplied together with the output signal of the NOR gate NOR2 of the mantissa-part-bit control circuit 40 to input terminals of a NAND gate 90. The control bit B is supplied together with the output signal of the inverter INV1 of the mantissa-part-bit control circuit 40 to input terminals of a NOR gate 91. Similarly, the control bit C is supplied together with the output signal of the NOR gate NOR2 to input terminals of a NAND gate 92. Output signals of the gates 90 to 92 are supplied to the error correction circuit 61 respectively through inverters 93 to 95.

With this construction, when the output signal of the exclusive OR gate 86 is "1" and when both of the signals $S_5$ and $S_6$ outputted from the exponent-value detector 13 are "0", the states of the output signals of the inverters 72 to 75 vary in accordance with the states of the control bits A to C so that the voltage of an output signal $S_B$ of the mantissa-part DAC 22a is shifted as shown in Table 2.

TABLE 2

| A | B | C | shift amount |
|---|---|---|---|
| 0 | 0 | 0 | $-V_{LSB}/2$ |
| 0 | 0 | 1 | $-V_{LSB}/4$ |
| 0 | 1 | 0 | 0 |
| 0 | 1 | 1 | $+V_{LSB}/4$ |
| 1 | 0 | 0 | $+V_{LSB}/2$ |

It will be appreciated from Table 2 that when the control bits A, B and C are, for example, "0", "0" and "0", respectively, the voltage of the signal $S_B$ is decreased by an amount equal to half of $V_{LSB}$, wherein $V_{LSB}$ is a voltage which is controlled by the last-bit stage of the mantissa-part DAC 22a.

When any one of the signals $S_5$ and $S_6$ is "1", the output of the NOR gate NOR2 is rendered "0", while the output of the inverter INV1 is rendered "1". As a result, the output signals of the NAND gate 90, NOR gate 91 and NAND gate 92 are rendered "1", "0" and "1", respectively, which is equivalent to the case where the control bits A, B and C are equal respectively to "0", "1" and "0". And therefore, no correction is carried out in this case. In other words, the correction of the output signal $S_B$ is performed only when the mantissa-part DAC 22a operates as a twelve-bit DAC.

Although the maximum number of bits of the mantissa-part DACs 22 and 22a and the number of stages of the exponent-part DAC 61 are 12 and 7, respectively, in the aforesaid embodiments, these numbers can be changed to any desired values. Also, the number of bits of the input data $D_{IN}$ should not necessarily be restricted to "16".

As described above, with the DAC according to the present invention, the accuracy of the mantissa-part DAC in terms of the resolution thereof can be enhanced at lower signal levels, while the minimum step of variation of the output signal of the mantissa-part is decreased at higher signal levels. With this DAC therefore, the total harmonic distortion can be decreased over a range from the lower signal levels to the higher signal levels.

What is claimed is:

1. A digital-to-analog converter for converting digital input data into an analog output signal comprising:
    (a) detector means responsive to the digital input data for outputting a detection signal representative of an exponent value of said digital input data;
    (b) digital-to-analog converting means of a predetermined number of bit stages, responsive to said detection signal, for converting a mantissa part of said digital input data into an intermediate analog signal;
    (c) analog shift means, responsive to said detection signal, for shifting said intermediate analog signal by an amount corresponding to the exponent value of said digital input data, said analog shift means outputting said shifted analog signal as the analog output signal; and
    (d) control means, responsive to said detection signal, for changing the number of operative bit stages of said digital-to-analog converting means, said control means decreasing the number of operative bit stages of said digital-to-analog converting means with a decrease of the exponent value of said digital input data.

2. A digital-to-analog converter according to claim 1, wherein the digital input data is in the form of two's complement of the magnitude thereof, said detector means detecting the number of leading "0" bits of the digital input data when the digital input data is positive and detecting the number of leading "1" bits of the digital input data when the digital input data is negative, said detector means outputting said detected number as said detection signal.

3. A digital-to-analog converter according to claim 2, wherein said digital-to-analog converting means comprises:
    digital shifting means responsive to said detection signal from said detector means for shifting the digital input data in the direction of the most significant bit thereof by bits equal in number to said detected number to form said mantissa part; and
    a digital-to-analog converting, circuit of the predetermined number of bit stages for converting said mantissa part into an analog form to produce said intermediate analog signal.

4. A digital-to-analog converter according to claim 3, wherein said digital-to-analog converting circuit comprises an R-2R resistor ladder network of the predetermined number of bit stages, the 2R ladder elements of said ladder network being coupled to the digital shifting means so as to be supplied with one or more bits of said mantissa part of the digital input data, one terminal end of said ladder network on the side constituting the least significant bit stage thereof being supplied with a bias voltage to determine the center of range of said intermediate analog signal, said intermediate analog signal being outputted from the other terminal end of said ladder network which constitutes the most significant bit stage thereof.

5. A digital-to-analog converter according to claim 4, wherein said control means comprises a control circuit which causes the 2R ladder elements of a group of one or more of the less significant bit stages of said ladder network to be supplied with said bias voltage to thereby prevent said group of less significant bit stages from functioning, the number of said one or more less significant bit stages being determined in accordance with said detection signal.

6. A digital-to-analog converter according to claim 1, wherein said analog shifting means comprises:
circuit means responsive to said intermediate analog signal to produce a predetermined number of analog signals whose voltages are $2^{-n}$ ($n=0, 1, 2, \ldots$) magnifications of said intermediate analog signal; and
switch circuit means connected to said circuit means for selectively outputting one of said predetermined number of analog signals as the analog output signal in accordance with said detection signal.

7. A digital-to-analog converter according to claim 6, wherein said circuit means comprises an r-2r resistor ladder network connected at one end thereof to said digital-to-analog converting means.

8. A digital-to-analog converter according to claim 4 further comprises terminal means for receiving a predetermined number of control bits and a correction circuit means connected with said one terminal end of said R-2R resistor ladder network, said correction circuit means causing said bias voltage at said one terminal end of said R-2R resistor ladder network to vary in accordance said control bits.

9. A digital-to-analog converter according to claim 8, wherein said correction circuit means is further responsive to a sign bit of the digital input data, and causes said bias voltage at said one terminal end of said R-2R resistor ladder network to vary in accordance said control bits only when said sign bit is in a predetermined state.

10. A digital to analog converter for converting a time variant digital input signal into a time variant analog signal, comprising:
an input port for receiving an input data signal, the input data signal being composed of a plurality of bits, a first group of which represents a mantissa value and a second group of which represents both the number of bits in the first group and an exponent value;
decoder means, coupled to the input port, for receiving a portion of the input signal and generating a first data signal representing the number of bits in the first group and a second data signal representing the exponent value;
a mantissa digital-to-analog converter, coupled to receive the first group of bits, the mantissa digital-to-analog converter including a number of bit stages which are connected together in a weighted sum fashion so as to produce an analog signal composed of a plurality of differently weighted signal levels, wherein the signal levels are either less than, greater than or equal to a preselected zero level and wherein the bit stages are adapted to operatively respond to the first group of bits to produce therefrom a first analog signal whose amplitude represents the mantissa value, and wherein the mantissa digital-to-analog converter further includes a neutralizing means, which is responsive to the second data signal, for selectively neutralizing one or more of the less signficant bit stages in the mantissa digital-to-analog converter such that the neutralized bit stages will not contribute non-zero signal levels to the first analog signal; and
an exponent multiplier means, coupled to the decoder means and the mantissa digital-to-analog converter, for multiplying the first analog signal by the exponent value represented by the second data signal to produce a second analog signal.

11. A digital to analog converter according to claim 10 further comprising a digital shifting means, responsive to the decoder means, for shifting the first group of bits by a number of bit positions as a function of the number of bits in the second group of bits and for transferring the shifted first group of bits to the more significant bit stages of the mantissa digital-to-analog converter when the number of bit stages in the mantissa digital-to-analog converter exceeds the number of bits in the first group.

12. A digital to analog converter comprising:
an output terminal;
an R-2R ladder network having a series of R-2R bit stages arranged in order of significance from a least significant end of the network to a most significant end of the network, the most significant end being connected to the output terminal;
a voltage supply means for supplying a first voltage to the R-2R ladder network, the magnitude of the first voltage relative to a ground level being representative of a full range of discrete output voltage levels than can be generated at the output terminal;
a biasing means, connected to the least significant end of the network, for generating a bias voltage thereat which is less than the first voltage and greater than the ground level; and
a plurality of switching means for applying either the first voltage or the ground level to respective 2R elements of the R-2R ladder network, wherein at least one of the switching means is adapted to also apply an intermediate voltage, between the first voltage and the ground level, to a respective one of the 2R elements.

13. A digital to analog converter according to claim 12 wherein at least two of the switching means are adapted to apply the intermediate voltage to their respective 2R elements, and wherein the biasing means includes a bias correction means, responsive to the status of the plurality of switching means, for detecting which of the switching means are applying the intermediate voltage to their respective 2R elements and for adjusting the bias voltage in accordance with the number of 2R elements that are being biased by the intermediate voltage.

14. A digital-to-analog converter for converting digital input data into an analog output signal, where the digital input data is composed of an a mantissa part and has an exponent value, the exponent value representing a magnitude range and the mantissa part representing a magnitude within the magnitude range, comprising:
(a) detector means responsive to the digital input data for detecting the magnitude range thereof, said detector means outputting a detection signal representative of the magnitude range of said digital input data;
(b) digital-to-analog converting means of a predetermined number of bit stages, responsive to said detection signal for converting the mantissa part of said digital input data into an intermediate analog signal, the bit stages being adapted to operatively respond to the mantissa part of the digital input data;
(c) analog shift means responsive to said detection signal for shifting said intermediate analog signal by an amount corresponding to the magnitude range of said digital input data, said analog shift means outputting said shifted analog signal as the analog output signal; and (d) control means responsive to said detection signal for changing the number of operative bit stages of said digital-to-analog converting means, said control means decreasing the number of operative bit stages of said digital-to-analog converting means with a decrease of the magnitude range of said digital input data.

15. A digital-to-analog converter according to claim 14 wherein the detector means includes means for detecting the exponent value and for outputting a shift signal representative of the detected exponent value, the digital-to-analog converter further comprising a digital shift means for shifting the bits of the mantissa part by a number of bit positions in response to the shift signal.

16. A digital-to-analog converter for converting digital input data into an analog output signal, where the digital input data is composed of a number of bits and includes size information representing an exponent value and a bit length number, the bit length number being the number of bits in a variable length mantissa part of the digital input signal, comprising:

(a) detector means, responsive to the size information of the digital input data, for outputting a detection signal representative of the exponent value of said digital input data;

(b) digital-to-analog converting means of a predetermined number of bit stages, responsive to said detection signal, for converting the mantissa part of said digital input data into an intermediate analog signal, the bit stages being adapted to operatively respond to the mantissa part bits of the digital input data;

(c) analog shift means, responsive to said detection signal, for shifting said intermediate analog signal by an amount corresponding to the exponent value of said digital input data, said analog shift means outputting said shifted analog signal as the analog output signal; and (d) control means, responsive to said detection signal, for changing the number of operative bit stages of said digital-to-analog converting means, said control means decreasing the number of operative bit stages of said digital-to-analog converting means with a decrease of the exponent value of said digital input data.

* * * * *